United States Patent [19]

Chao et al.

[11] Patent Number: 5,264,248
[45] Date of Patent: Nov. 23, 1993

[54] ADHESION OF METAL COATINGS OF POLYPYROMELLITIMIDES

[75] Inventors: Herbert S. Chao, Schenectady; Bradley R. Karas, Amsterdam, both of N.Y.

[73] Assignee: General Electric Company, Schenectady, N.Y.

[21] Appl. No.: 923,669

[22] Filed: Aug. 3, 1992

[51] Int. Cl.[5] .................. C23C 14/00; C23C 26/00
[52] U.S. Cl. ................................ 427/250; 427/124; 427/248.1; 427/304; 427/306
[58] Field of Search ............ 427/304, 306, 124, 250, 427/248.1

[56] References Cited

U.S. PATENT DOCUMENTS

| | | | |
|---|---|---|---|
| 3,767,538 | 10/1973 | Politycki | 427/307 |
| 3,932,689 | 1/1976 | Watanabe | 428/461 |
| 3,953,658 | 4/1976 | Brandt | 427/123 |
| 3,955,024 | 5/1976 | Goldman | 427/98 |
| 4,281,038 | 7/1981 | Ambros | 428/901 |
| 4,515,829 | 5/1985 | Deckert | 427/306 |
| 4,710,403 | 12/1987 | Krause et al. | 427/304 |
| 4,842,946 | 6/1989 | Foust | 427/304 |
| 4,846,929 | 7/1989 | Bard | 427/307 |
| 4,857,143 | 8/1989 | Glenning | 156/655 |
| 4,873,136 | 10/1989 | Foust | 427/304 |
| 4,999,251 | 3/1991 | Foust et al. | 428/458 |
| 5,098,516 | 3/1992 | Norman | 427/250 |

OTHER PUBLICATIONS

Mark et al., "Encyclopedia of Polymer Science and Engineering" vol. 12, John Wiley & Sons 1988, pp. 364–366.

Baum et al., Chem. Mater., 3, 714–720 (1991) (no month available).

Somasiri et al., ACS Symposium Series, 440, 235–240 (1990) (no month available).

Primary Examiner—Shrive Beck
Assistant Examiner—Vi Duong Dang
Attorney, Agent, or Firm—William H. Pittman

[57] ABSTRACT

The adhesion of metal coatings, such as those produced by electroless or physical vapor deposition, on polypyromellitimide surfaces is improved by prior treatment of the surface with concentrated sulfuric acid, followed by aqueous alkali metal hydroxide of at least about 2M concentration. Further metal may be deposited on the surface, for example by electrolytic or physical vapor deposition, following the original metal deposition.

15 Claims, No Drawings

ADHESION OF METAL COATINGS OF POLYPYROMELLITIMIDES

This invention relates to the improvement of adhesion of metal coatings to polyimide surfaces, and more particularly their adhesion to polypyromellitimide surfaces.

Polypyromellitimides, i.e., polyimides of the type prepared by the reaction of pyromellitic dianhydride with various aromatic diamines, are noted for their solvent resistance, thermal stability, good mechanical properties and low dielectric constant. They are in wide use for various purposes, including as substrates for metallization. Metallized polypyromellitimides are useful in printed circuit boards, both rigid and flexible. For that purpose, the metal layer is patterned by additive, semi-additive or subtractive methods known in the art.

However, the adhesion of polypyromellitimides to metal layers deposited thereon is frequently poor. Adhesion is generally measured as "peel strength", which is the force required to peel an adherent metal layer from a substrate under controlled conditions. The peel strengths of metal layers on polypyromellitimides are typically no higher than about 20 g/mm.

One of the most serious problems which arise in the metallization of plastics is the lack of adhesion of the metal layer to the substrate. Various methods for improving the adhesion of metal layers to polypyromellitimides have been disclosed. For example, Baum et al. in *Chem. Mater.*, 3, 714–720 (1991), provide a detailed discussion of the adhesion of electroless copper layers to polypyromellitimides; they found that adhesion was improved by pretreatment of the surface with sodium hydroxide. Such treatment, however, only increases peel strength to values in the range of 70–110 g/mm, a relatively modest improvement.

More elaborate systems which improve adhesion to a greater extent are known. For example, U.S. Pat. No. 4,710,403 discloses a metallization process which includes injection of electrons into the polymer prior to metal deposition. This is typically achieved by treatment with $K_2Te$ followed by cupric acetate. As described by Somasiri et al. in *ACS Symposium Series*, 440, 235–240 (1990), adhesion of a copper layer is increased by this method to values in the range of about 125–180 g/mm (i.e., about 7–10 lbs./in.). It will be readily apparent, however, that any method requiring the use of tellurium compounds is exceedingly expensive. Moreover, such compounds are highly toxic. Cheaper and more environmentally compatible methods are definitely desirable.

The present invention provides a method for treatment of polypyromellitimide surfaces to improve adhesion of metal layers. Said method requires only readily available acids and bases and relatively short treatment times, and thus may be practiced quite inexpensively and simply.

In one of its aspects, therefore, the invention is a method for improving adhesion of a metal layer to the surface of a non-fluorinated polypyromellitimide which comprises contacting said surface first with sulfuric acid of at least about 90% concentration by weight for at least about 20 seconds, and then with an aqueous alkali metal hydroxide solution of at least about 2M concentration for at least about 30 seconds, and subsequently depositing said metal layer on said surface.

The polypyromellitimides to which the present invention applies are typically prepared by the reaction of pyromellitic dianhydride (hereinafter sometimes "PMDA"), optionally in admixture with minor proportions of other dianhydrides, with non-fluorinated aromatic diamines. Similar polyimides prepared from fluorinated diamines are also known, but their degree of adhesion to metals is substantially different and is not an issue dealt with by the present invention. When used hereinafter, the word "polypyromellitimides" will generally mean those prepared from non-fluorinated diamines.

Any known diamines, including diamine mixtures, may be employed, but aromatic diamines are generally preferred. They include p-phenylenediamine, m-phenylenediamine and 4-aminophenyl ether, also known as "oxydianiline". The reaction products of PMDA and 4-aminophenyl ether are particularly preferred; they are commercially available from DuPont under the trade name KAPTON.

Prior to the method of this invention, it is frequently preferred to clean the surface of the substrate with a degreasing agent, typically a halohydrocarbon such as 1,1,2-trichlorotrifluoroethane, or with a conventional detergent.

In the first step of the method of the invention, the polypyromellitimide surface is contacted with sulfuric acid of at least about 90% concentration by weight. Commercial concentrated sulfuric acid, having a concentration of at least about 95%, is generally preferred for reasons of convenience and particular suitability. The treatment temperature is not critical but is most often in the range of about 20°–80° C., with about 20°–40° C. being preferred. Treatment time should be at least about 20 seconds and preferably about 30–60 seconds. A thorough water rinse ordinarily follows the acid treatment step.

The polypyromellitimide surface is then contacted in the second step with an aqueous solution of an alkali metal hydroxide such as sodium hydroxide or potassium hydroxide, hereinafter sometimes designated "base solution". Potassium hydroxide is often preferred by reason of its particular suitability.

The hydroxide concentration of the base solution should be at least about 2M. It is usually at least about 3M and preferably about 5–6M. Base solutions are known to absorb carbon dioxide over prolonged storage periods, with conversion in part to the corresponding alkali metal bicarbonate or carbonate. The above-specified concentrations are of hydroxide; any carbonate or bicarbonate present should be disregarded in calculating the base concentration.

The treatment temperature with the base solution is not critical but is typically about 20°–60° C., with about 20°–40° C. being preferred. The treatment time should be at least about 30 seconds and may be up to 10 minutes, with times up to about 5 minutes being preferred. A second water rinse typically follows the base treatment.

Following the above-described treatment, the polypyromellitimide surface is metallized by conventional techniques. Typical metals employed are copper and nickel, and the adhesion of both is improved by the present invention.

Metallization may be performed immediately after treatment with sulfuric acid and base. It is also within the scope of the invention, however, to store the treated article for a period up to several days before metallizing. Even after such storage in contact with air, the metallization step affords an article with improved adhesion of the metal to the resin surface.

Typical metallization techniques which may be employed are physical vapor deposition and electroless deposition. Physical vapor deposition is particularly useful for forming copper coatings. It is conducted by placing the substrate and elemental copper in a vacuum chamber and heating the copper to a suitable vaporization temperature. Upon contact with the cooler substrate, the copper vapors condense to form a metallic copper layer.

Electroless deposition is useful with numerous metals, including copper and nickel. Such methods generally begin with a pretreatment to aid in the absorption of electroless deposition catalyst, typically with a reagent such as Shipley Cleaner/Conditioner 1175A which is an alkaline solution containing organic compounds. This is followed by treatment with an acidic palladium-containing solution as catalyst, illustrated by Shipley 44 which comprises tin and palladium compounds, the palladium being the principal catalytic species. Catalyst treatment may be preceded and/or accompanied by surface activation employing, for example, Shipley Cataprep ® 404 containing sodium bisulfate and various surfactants.

After a water rinse, the substrate may be immersed in a solution of Shipley Accelerator 19, a fluoboric acid-containing formulation used to remove tin, or an equivalent thereof. It may then be further rinsed with water and treated with one or more electroless plating solutions.

Electroless plating baths are well known in the art and are generally described, for example, in Kirk-Othmer, *Encyclopedia of Chemical Technology*, Third Edition, Volume 8, the contents of which are incorporated herein by reference. The selection of a particular electroless plating bath or process is not critical to the invention. The contents of the bath and the plating parameters such as temperature, pH and immersion time will of course depend on the metal to be deposited, as well as on the precise nature of the resinous substrate.

Suitable plating baths include Shipley Cuposit ® 250 and 251 and Enthone Enplate ® NI-426. The former two are electroless copper solutions and the latter an electroless nickel solution. Following metallization by electroless deposition, the metal layer should be heat-treated, typically at a temperature in the range of about 60°-120° C., for a period of time sufficient to stabilize adhesion properties.

A further metal coating may be deposited on the substrate after the initial metal deposition. Deposition of said further coating may be by conventional methods including electroless and electrolytic deposition, the details of which are likewise known to those skilled in the art, and should be followed by heat-treatment as described above.

Metal articles comprising resinous substrates subjected to treatment by the above-described method are another aspect of the invention. They have substantially improved adhesion of the metal to the resin surface, in comparison with untreated substrates. This is shown by the results of a peel test (IPC method 2.4.8) in which strips of tape, 3.2 mm. wide, are used to mask portions of the metallized surface after deposition of electrolytic copper and the exposed copper is etched away with concentrated nitric acid. The substrate is rinsed thoroughly in water, after which the tape is removed and the remaining copper strips subjected to a 90° peel test.

The invention is illustrated by the following examples. The polypyromellitimides employed therein were two different commercial polymers prepared from pyromellitic dianhydride and 4-aminophenyl ether; they are identified as "polyimide 1" and polyimide 2".

EXAMPLE 1

Samples of 5-mil films of polypyromellitimide were mounted on a solid support so that one surface was exposed, and the surface was cleaned with a commercially available detergent. They were then treated with concentrated sulfuric acid for 30 seconds, thoroughly rinsed with aerated water and further treated with freshly prepared 5M aqueous base solution, followed by another water rinse. The acid and base treatments were both at room temperature and various treatment periods were employed.

The polyimide films were then coated with an electroless copper layer by the following scheme of operations:

Water rinse—2 minutes;
Shipley Cleaner-Conditioner 1175A—5 minutes, 2.5% by volume, 75° C.;
Water rinse—2 minutes;
Shipley Cataprep 404—1 minute, 270 g/l;
Shipley Cataposit 44—3 minutes, 1.5% by volume, with Cataprep 404 at 270 g/l, 44° C.;
Water rinse—2 minutes;
Shipley Accelerator 19—3 minutes, 16% by volume;
Water rinse—2 minutes;
Shipley Cuposit 251 electroless copper plating solution—2 minutes, 48° C.

The metallized film was heat-treated for 2 hours at 75° C. Finally, an electrolytic copper coating was deposited by treatment in an acid copper bath for 60 minutes at a current density of 0.032 A/cm.$^2$.

Peel test strips were created in the electroplated films and the films were heat-treated for the times listed in Table I and subjected to the above-described peel strength test in comparison with controls employing only acid treatment, only base treatment or treatment with a base solution of less than 2M concentration. The results are given in Table I, with the controls designated "C".

TABLE I

| | Run no. | | | | | | | | |
|---|---|---|---|---|---|---|---|---|---|
| | 1 | 2 | C1 | C2 | 3 | 4 | C3 | 5 | C4 |
| Polyimide | 1 | 1 | 1 | 1 | 2 | 2 | 2 | 1 | 1 |
| Acid treatment, sec. | 30 | 30 | 30 | — | 30 | 30 | — | 30 | 30 |
| Base treatment: | | | | | | | | | |
| Cation | K | K | — | K | K | K | K | Na | Na |
| Concentration, M | 5 | 5 | — | 5 | 5 | 5 | 5 | 5 | 1 |
| Time, sec. | 30 | 300 | — | 300 | 30 | 300 | 300 | | |
| Peel strength, g/mm: | | | | | | | | | |
| 1 hr. | 149 | 204 | * | 127 | 234 | 215 | 113 | 247 | 122 |
| 2 hr. | 252 | 188 | * | 120 | 234 | 233 | 100 | 172 | 111 |
| 3 hr. | 227 | 218 | * | 107 | 218 | 179 | 88 | 184 | 88 |

*Did not plate.

The results in Table I show the improvement in peel strength as a result of treatment with the method of the invention, as compared to the corresponding controls involving treatment only with acid, only with base or with a combination of acid and base having a lower concentration than the required 2M.

EXAMPLE 2

The procedure of Example 1 was repeated, replacing the copper plating solution by Enthone Enplate NI-426 nickel plating solution and plating for 2 minutes at 53° C. and a pH of 6.2. Treatment in each case was for 30 seconds with sulfuric acid and for 30 seconds with freshly prepared 5M aqueous potassium hydroxide solution. The results are given in Table II.

TABLE II

|  | Run no. | |
| --- | --- | --- |
|  | 6 | 7 |
| Polyimide | 1 | 2 |
| Peel strength, g/mm: | | |
| 1 hr. | 193 | 204 |
| 2 hrs. | 165 | 141 |
| 3 hrs. | 166 | 132 |

EXAMPLE 3

Films of polyimide 1 were treated with sulfuric acid and base in accordance with Example 1, and blown dry with filtered nitrogen. They were then placed in a vacuum chamber and about 1500 Angstroms of copper was deposited by physical vapor deposition. The metallized films were attached to a backing plate and electrolytic copper was deposited thereon to a total copper thickness of 42.5 microns. Peel test strips were created and heat-treated and peel strength measurements were taken as in Example 1.

The results are given in Table III, in comparison with a control which was not treated with sulfuric acid and base. In Run 8, metallization was conducted immediately after sulfuric acid and base treatment; in Run 9, the treated substrate was stored for 36 hours under ambient conditions before metallization.

TABLE III

| Heat-treatment time, hours | Run 8 | Run 9 | Control |
| --- | --- | --- | --- |
| 1 | 136 | 157 | 16 |
| 2 | 120 | 128 | — |
| 3 | 115 | 130 | — |
| 4 | — | — | 16 |
| 70 | — | — | 20 |

What is claimed is:

1. A method for improving adhesion of a metal layer to the surface of a non-fluorinated polypyromellitimide which consists essentially of contacting said surface first with a material consisting essentially of aqueous sulfuric acid of at least about 90% concentration by weight for at least about 20 seconds, and then with a material consisting essentially of an aqueous alkali metal hydroxide solution of at least about 2 M concentration for at least about 20 seconds with optional rinsing with water after each contact and subsequently depositing said metal layer on said surface.

2. A method according to claim 1 wherein said metal layer is deposited by electroless deposition or physical vapor deposition.

3. A method according to claim 2 wherein said surface is cleaned prior to said contact with sulfuric acid.

4. A method according to claim 3 wherein the sulfuric acid has a concentration of at least about 95%.

5. A method according to claim 3 wherein the temperature of sulfuric acid contact is in the range of about 20°-40° C.

6. A method according to claim 4 wherein the sulfuric acid contact time is in the range of about 30-60 seconds.

7. A method according to claim 6 wherein the alkali metal hydroxide solution has a concentration of about 5-6M.

8. A method according to claim 7 wherein the alkali metal in the alkali metal hydroxide solution is sodium or potassium.

9. A method according to claim 7 wherein the temperature of alkali metal hydroxide contact is in the range of about 20°-40° C.

10. A method according to claim 7 wherein the alkali metal hydroxide contact time is from about 30 seconds to about 5 minutes.

11. A method according to claim 3 wherein the polypyromellitimide is the polymerization product of pyromellitic dianhydride and at least one non-fluorinated aromatic diamine.

12. A method according to claim 11 wherein the aromatic diamine is 4-aminophenyl ether.

13. A method according to claim 3 wherein the metal is copper and is deposited by physical vapor deposition.

14. A method according to claim 3 wherein the metal is copper or nickel and is deposited by electroless deposition.

15. A method according to claim 3 wherein a further metal coating is deposited on the substrate after the initial metal deposition.

* * * * *